United States Patent [19]
Tanaka

[11] Patent Number: 4,779,013
[45] Date of Patent: Oct. 18, 1988

[54] SLEW-RATE LIMITED OUTPUT DRIVER HAVING REDUCED SWITCHING NOISE

[75] Inventor: Yasunori Tanaka, Yokohama, Japan

[73] Assignee: Kabushiki Kaisha Toshiba, Kanagawa, Japan

[21] Appl. No.: 894,914

[22] Filed: Aug. 8, 1986

[30] Foreign Application Priority Data

Aug. 14, 1985 [JP] Japan ............................. 60-177688

[51] Int. Cl.$^4$ .......................................... H03K 19/003
[52] U.S. Cl. .................................... 307/443; 307/448; 307/451; 307/475; 307/263
[58] Field of Search ............... 307/443, 448, 451–453, 307/475, 481, 542, 548, 550, 555, 557–558, 572, 579, 585, 246, 263

[56] References Cited

U.S. PATENT DOCUMENTS

| | | | |
|---|---|---|---|
| 3,909,633 | 9/1975 | Hall, II | 307/443 X |
| 4,424,456 | 1/1984 | Shiraki et al. | 307/475 X |
| 4,477,741 | 10/1984 | Moser, Jr. | 307/442 X |
| 4,499,387 | 2/1985 | Konishi | 307/469 X |
| 4,518,880 | 5/1985 | Masuda et al. | 307/297 X |
| 4,549,101 | 10/1985 | Sood | 307/443 |
| 4,553,045 | 11/1985 | Murotani | 307/443 X |
| 4,567,378 | 1/1986 | Raver | 307/263 X |
| 4,604,731 | 8/1986 | Konishi | 307/475 X |
| 4,622,482 | 11/1986 | Ganger | 307/263 X |
| 4,638,187 | 1/1987 | Boler et al. | 307/451 |

FOREIGN PATENT DOCUMENTS

2063025 5/1981 United Kingdom ................ 307/443

*Primary Examiner*—Stanley D. Miller
*Assistant Examiner*—D. R. Hudspeth
*Attorney, Agent, or Firm*—Foley & Lardner, Schwartz, Jeffery, Schwaab, Mack, Blumenthal & Evans

[57] ABSTRACT

An output circuit device according to the present invention comprises first circuit means (1) having a first type MOS transistor and a second type MOS transistor connected in parallel to each other, second circuit means (3) having at least a first type MOS transistor and a second type MOS transistor connected in parallel to each other, and a load capacitor means (13) connected between the output terminal and the ground potential for charging and discharging electric charge of an output signal.

The source of said first type MOS transistor is connected to a first power supply and the source of said second type MOS transistor being connected to a second power supply.

The second circuit means is connected between the output of said first circuit means and an output terminal. The source of the first type MOS transistor in the second circuit means is connected to the first power supply. The source of the second type MOS transistor is connected to the second power supply. The first and second type MOS transistors have a first threshold voltage level.

Thereby, undershoot and overshoot phenomena are suppressed when the output potential of the first and second type MOS transistors in the second circuit means reaches the threshold voltage level.

12 Claims, 10 Drawing Sheets

SLEW-RATE LIMITED OUTPUT DRIVER HAVING REDUCED SWITCHING NOISE

BACKGROUND OF THE INVENTION

1. Field of the Invention

The present invention relates to an output circuit device, more particularly to an output circuit device which can realize stabilization of the output potential and the power supply potential.

2. Description of the Prior Art

In the recent semiconductor devices, there is a tendency to increase the degree of integration and density in order to reduce the size of the chip, as well as a tendency to increase the driving capability of transistors to make their operation fast.

In order to reduce the chip size, it is necessary to reduce the width of the wiring formed by aluminum or the like . By the reduction in the width of the wiring, the inductive load that exists in the wiring, namely, inductance, will have to be increased. Further, when the current driving capability is increased by increasing the size of the transistor, there will be generated problems that are caused by the increase in the inductive load of the wiring. This problem will now be described by making reference to FIGS. 1 and 2.

FIG. 1 shows an example of the configuration of a general inverter circuit that takes into account the inductance components of the wirings for the power supply and the output. It consists of a P-channel MOS transistor (PMOS transistor) 101 and an N-channel MOS transistor (NMOS transistor) 103. The source terminal of the PMOS transistor 101 is connected to a high level voltage source $V_{DD}$ that supplies a potential $V_{DD}$ via an inductance 105 that exists in a power supply wiring made of aluminum, and the source terminal of the NMOS transistor 103 is connected to a low level voltage source $V_{SS}$ that supplies a potential $V_{SS}$ (normally OV) via an inductance 107 that exists in a power supply wiring made of aluminum. Further, the PMOS transistor 101 and the NMOS transistor 103 have both of their gate terminals connected to the input terminal IN that inputs a signal to be inverted, and at the same time, their respective drain terminals are connected to the output terminal OUT via an inductance 109 that exists in the output wiring made of aluminum, and the output terminal OUT is connected to a load capacitor 111.

When a low level (potential $V_{SS}$) signal is input to the input terminal IN, the PMOS transistor 101 will switch to an on-state and the NMOS transistor 103 will switch to an off-state. Then, a current flows into the load capacitor 111 from the high level voltage source $V_{DD}$ via the PMOS transistor 101, bringing the output terminal OUT to the high level (potential $V_{DD}$). On the contrary, when a high level signal (potential $V_{DD}$) is input to the input terminal IN, the PMOS transistor 101 will switch to the off-state and the NMOS transistor 103 to the on-state. Then, charge accumulated in the load capacitor flows into the low level voltage source $V_{SS}$ via the NMOS transistor 103, bringing the output terminal OUT to a low level (potential $V_{SS}$). Therefore, by the operation described above, there will be output from the output terminal OUT a signal which is the inversion of the signal that was input to the input terminal IN.

Now, in an inverter circuit with the above configuration, when the current driving capability of the transistors is enhanced by increasing the transistor size, in order to have a quickly inverted output potential, the on-resistance of the transistors becomes small, and there will be formed, between the high level voltage source $V_{DD}$ and the load capacitor 111, or between the low level voltage source $V_{SS}$ and the load capacitor 111, a resonance circuit that consists of the load capacitor and the inductance that exists in the power supply wiring and the output wiring. Then, as shown in FIG. 2, when the input potential changes from potential $V_{SS}$ to potential $V_{DD}$, the NMOS transistor 103 switches to the on-state, and the output potential drops from potential $V_{DD}$ to potential $V_{SS}$. Due to the rapid flow of charge that was accumulated in the load capacitor 111 to the low level voltage source $V_{SS}$, a transient current flows in the vicinity of potential $V_{SS}$, giving rise to the so-called undershoot phenomenon. On the contrary, when the output potential is raised from potential $V_{SS}$ to potential $V_{DD}$ by the rapid charging due to flow of a current to the load capacitor 111 from the high level voltage source $V_{DD}$, a transient current flows in the vicinity of potential $V_{DD}$, giving rise to the so-called overshoot phenomenon.

As a result, the output potential varies temporarily immediately after it is inverted, giving rise to a problem of transmitting signals at erroneous potentials. Furthermore, it causes variations in the high level voltage source $V_{DD}$ and the low level voltage source $V_{SS}$, which leads to a fear of generating malfunctions in the circuit through variations in the input and output levels of the other elements that are connected to the same power supply wiring.

SUMMARY OF THE INVENTION

An object of the present invention is to provide an output circuit device which makes it possible to improve the stability in the output potential and the power supply potential.

Another object of the present invention is to provide an output circuit device which is capable of suppressing the overshoot and the undershoot phenomena in the output potential.

Another object of the present invention is to provide an output circuit device which can suppress the transient current that may be generated during charging or discharging of a load that is connected to the output terminal, by controlling the driving capability of the output circuit device in response to the output potential.

A feature of the present invention exists in that in an output circuit device there are provided a first circuit which outputs an input signal by inverting it, a capacitive load which charges or discharges the output signal from the first circuit, and a second circuit which is connected to the first circuit for varying the rate of charging or discharging of the capacitive load in response to the potential of the output signal. The first circuit means has a first type MOS transistor and a second type MOS transistor that are connected in parallel to each other, the source of the first type MOS transistor is connected to a first power supply, the source of the second type MOS transistor is connected to a second power supply, and the gates of the first and the second type MOS transistors are connected in parallel to the input terminal.

Further, the second circuit means has at least a first type MOS transistor and a second type MOS transistor that are connected in parallel to each other, as well as it is connected between the output side of the first circuit means and the output terminal, with the source of the first type MOS transistor of the second circuit means connected to the first power supply, the source of the second type MOS transistor of the same circuit means connected to the second power supply, and the first and the second MOS transistors having a first threshold voltage level.

These and other objects, features and advantages of the present invention will be more apparent from the following description of the preferred embodiments, taken in conjunction with the accompanying drawings.

DESCRIPTION OF THE PREFERRED EMBODIMENTS

Figure 1:
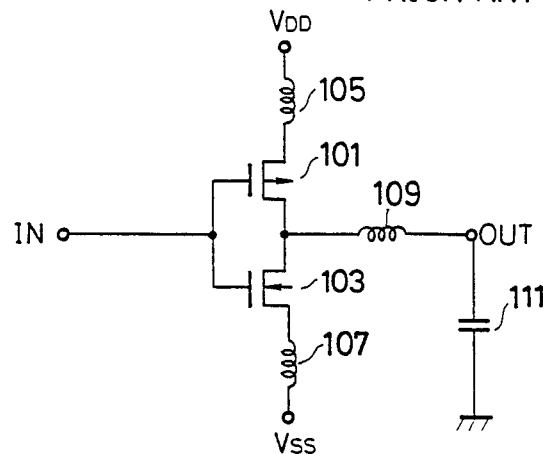
FIG. 1 is a circuit diagram for a prior art inverter circuit.
Figure 2:
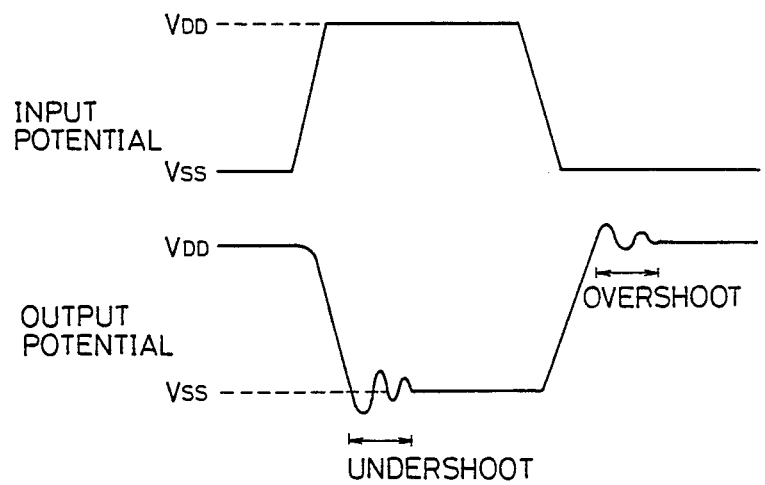
FIG. 2 is a graph for showing the input and output characteristic the inverter circuit shown in FIG. 1.
Figure 3:
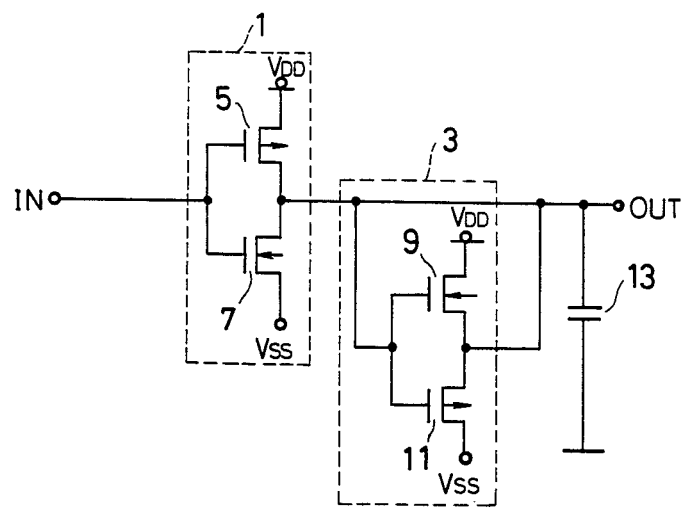
FIG. 3 circuit diagram for a first embodiment of the inverter circuit in accordance with the present invention.

Referring to FIG. 3, an inverter circuit embodying the present invention is shown. The inverter circuit comprises a first inverting unit 1 which inverts a signal that is input from the input terminal IN, a second inverting unit 3 driving of which is controlled by the output potential, and which assists the inverting operation that is performed by the first inverting unit 1, and a load capacitor 13 which is connected to the output terminal OUT.

The first inverting unit 1 consists of a first P-channel MOS type transistor (which will be called "first PMOS transistor" hereinafter) 5 and a first N-channel MOS type transistor (which will be called "first NMOS transistor" hereinafter) 7.

The first PMOS transistor 5 and the first NMOS transistor 7 have their respective gate terminals connected to the input terminal IN to which is input a signal to be inverted, and their respective drain terminals connected to the output terminal OUT which outputs the signal that is inverted. Further, the source terminal of the first PMOS transistor 5 is connected to a high level voltage source $V_{DD}$ that supplies a potential $V_{DD}$, and the source terminal of the first NMOS transistor 7 is connected to a low level voltage source $V_{SS}$ that supplies a potential $V_{SS}$ (normally 0V).

The second inverting unit 3 consists of a second N-channel MOS type transistor (called "second NMOS transistor" hereinafter) 9 and a second P-channel MOS type transistor (called "second PMOS transistor" hereinafter) 11.

The second NMOS transistor 9 and the second PMOS transistor 11 have both of their respective gate terminals and drain terminals connected to the output terminal OUT, the source terminal of the second NMOS transistor 9 is connected to the high level voltage source $V_{DD}$, and the source terminal of the second PMOS transistor 11 is connected to the low level voltage source $V_{SS}$ In addition, the output terminal is connected to the load capacitor 13.

Next, the operation of the first embodiment of the present invention with the above configuration will be described by making reference to FIG. 4.

Figure 4:
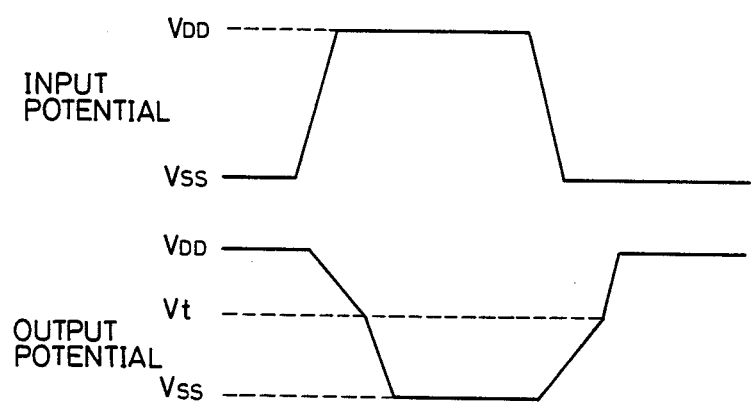
FIG. 4 is a graph for showing the input and output characteristic of the inverter circuit shown in FIG. 3.

First, the case in which the input potential of the input terminal IN is changed from low level (potential $V_{SS}$) to high level (potential $V_{DD}$), as shown in FIG. 4 will be described. It should be noted that prior to this change, the first PMOS transistor 5 and the second NMOS transistor 9 were in on-state, the first NMOS transistor 7 and the second PMOS transistor 11 were in off-state, the load capacitor 13 is charged by the feeding from the high level voltage source $V_{DD}$, and the output potential was in high level (potential $V_{DD}$).

When the high level signal input to the input terminal IN is supplied to the respective gate terminals of the first PMOS transistor 5 and the first NMOS transistor 7, the first PMOS transistor 5 is shifted from on-state to off-state while the first NMOS transistor 7 is shifted from off-state to on-state. By the shift of the first NMOS transistor 7 to on-state, charge, that was accumulated in the load capacitor 13 that is connected to the output terminal OUT during the time when the output terminal OUT was on high level, flows into the low level voltage source $V_{SS}$ via the first NMOS transistor 7, causing the output potential to start dropping as shown in FIG. 4. When the output potential drops to the threshold voltage $V_t$ for the second NMOS transistor 9 and the second PMOS transistor 11, the second NMOS transistor 9 is shifted from on-state to off-state, while the second PMOS transistor 11 is shifted from off-state to on-state. Because of this, a part of the charge that has been accumulated in the load capacitor 13 flows into the low level voltage source $V_{SS}$ via the second PMOS transistor 11.

In other words, when the input potential becomes high, charge that was accumulated in the load capacitor 13 is discharged via the first NMOS transistor alone, so that the output potential drops relatively slowly from potential $V_{DD}$ to potential $V_t$. From potential $V_t$ to potential $V_{SS}$, charge is discharged via both of the first NMOS transistor 7 and the second PMOS transistor 11, which means that the driving capability of the inverter circuit as a whole is increased, so that the output potential drops rapidly as shown in FIG. 4.

Because of this, at the point in time when the second inverting unit 3 is to be operated, the output potential is dropped to potential $V_t$ by a partial discharge of the charge that was accumulated in the load capacitor 13. Therefore, the transient current is small compared with the case of discharging the charge accumulated in the load capacitor in one step so that the undershoot phenomenon can be suppressed.

Next, the case in which the signal that is input to the input terminal IN is changed from high level to low level, while the output terminal OUT is in the low level state, will be described. When this low level signal is supplied to the gate terminals of the first PMOS transistor 5 and the first NMOS transistor 7, the first PMOS transistor 5 is shifted from off-state to on-state and the first NMOS transistor 7 is shifted from on-state to off-state. By the change to the on-state of the first PMOS transistor 5, a current flows from the high level voltage source $V_{DD}$ to the load capacitor 13 via the first PMOS transistor 5 which results in a start of rise in the output potential due to charging of the load capacitor 13, as shown in FIG. 4. When the output potential is raised to the threshold voltage $V_t$ of the second NMOS transistor 9 and the second PMOS transistor 11, the second NMOS transistor 9 is changed from off-state to on-state and the second PMOS transistor 11 is changed from on-state to off-state. Then, a part of the charge that is accumulated in the load capacitor 13 is supplied from the high level voltage source $V_{DD}$ via the second NMOS transistor 9.

Namely, when the input potential changes from high level to low level state and the output potential changes from potential $V_{SS}$ to potential $V_t$, charge is supplied from the high level voltage source $V_{DD}$ to the load capacitor 13 only through the first PMOS transistor 5 to charge the capacitor, resulting in a relatively slow rise in the output potential. During the rise of the output potential from potential $V_t$ to potential $V_{DD}$, charge is supplied from the high level voltage source $V_{DD}$ to the load capacitor 13 to charge it via both of the first PMOS transistor 5 and the second NMOS transistor 9, so that the output potential is raised rapidly as shown in FIG. 4.

Therefore, analogous to the case of the fall of the output potential, even if the output potential is raised rapidly by the operation of the second inverting unit 3, the transient current is small compared with the case of raising the output potential from potential $V_{SS}$ to potential $V_{DD}$ in one step, because the output potential is already raised to potential $V_t$ at the point in time when the second inverting unit 3 operates. Accordingly, the overshoot phenomenon can be suppressed.

Figure 5:
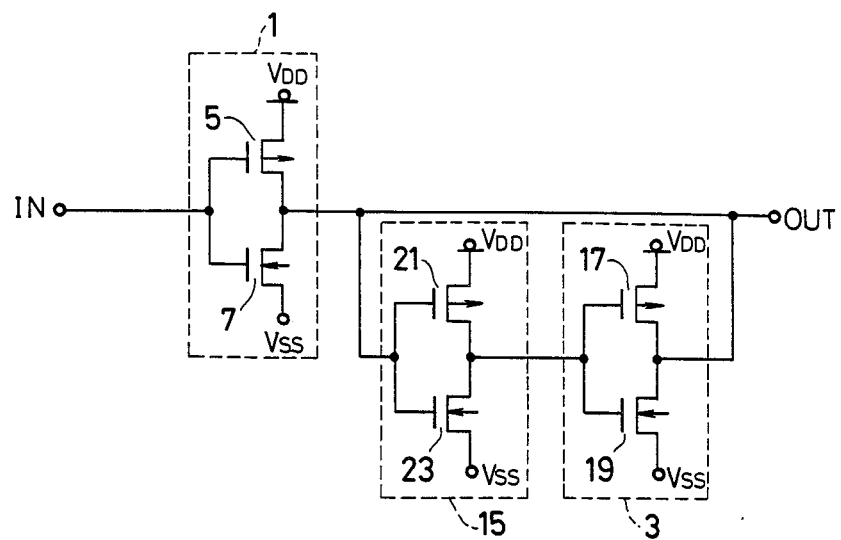
FIG. 5 is a circuit diagram for a second embodiment of the inverter circuit in accordance with the present invention.

In FIG. 5 is shown a second inverter circuit in accordance with the present invention. Its special feature is that in the inverter circuit shown in FIG. 3 there is provided a control unit 15 that controls the operation of the second inverting unit 3 by means of the output potential, in the first half of the second inverting unit 3. It is to be noted that in the embodiments to be described in the following, the load capacitor that is connected to the output terminal OUT will be omitted from the figure.

The control unit 15 consists of a CMOS circuit formed by a third P-channel MOS type transistor (called "third PMOS transistor" hereinafter) 21 and a third N-channel MOS type transistor (called "third NMOS transistor" hereinafter) 23.

The third PMOS transistor 21 and the third NMOS transistor 23 have their respective gate terminals connected to the output terminal OUT, and their drain terminals connected to each other, and the source terminal of the third PMOS transistor 21 is connected to the high level voltage source $V_{DD}$ while the source terminal of the third NMOS transistor 23 is connected to the low level voltage source $V_{SS}$ The second inverting unit 3 consists of a CMOS circuit formed by a fourth P-channel MOS type transistor (called "fourth PMOS transistor" hereinafter) 17 and a fourth N-channel MOS type transistor (called "fourth NMOS transistor" hereinafter) 19.

The fourth PMOS transistor 17 and the fourth NMOS transistor 19 have their respective gate terminals connected to the drain terminals of the third PMOS transistor 21 and the third NMOS transistor 23, and their respective drain terminals connected to the output terminal OUT. The source terminal of the fourth PMOS transistor 17 is connected to the high level voltage source $V_{DD}$ and the source terminal of the fourth NMOS transistor 19 is connected to the low level voltage source $V_{SS}$. Further, components with identical symbols as in FIG. 3 indicate the identical items and their description will be omitted.

Figure 6:
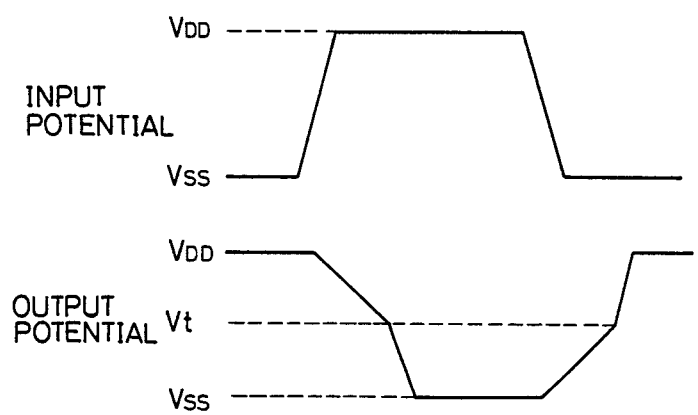
FIG. 6 is a graph for showing the input and output characteristics of the inverter circuit shown in FIG. 5.

With such a configuration, the control unit 15 carries out the inversion operation by the means of threshold voltage $V_t$ for the third PMOS transistor 21 and the third NMOS transistor 23, and also carries out the control of the operation of the second inverting unit 3, so that the second inverting unit 3 will operate in the same way as in the first embodiment. Therefore, the fall of the output potential from potential $V_{DD}$ to potential $V_t$ is carried out slow, whereas the drop from potential $V_t$ to potential $V_{SS}$ is rapid. Further, in the rise of the output potential, the increase from potential $V_{SS}$ to potential $V_t$ is carried out gently, whereas the rise from potential $V_t$ to potential $V_{DD}$ is carried out rapidly, as shown in FIG. 6.

Accordingly, with such a configuration, similar effects as in the first embodiment can be obtained. In addition, the source terminal of the fourth PMOS transistor 17 of the second inverting unit 3 is connected to the high level voltage source $V_{DD}$ and the source terminal of the fourth NMOS transistor 19 of the same unit is connected to the low level voltage source $V_{SS}$, so that the second inverting unit 3 can carry out a full swing operation between potential $V_{SS}$ and potential $V_{DD}$.

It should be noted that in the first and second embodiments, the first inverting unit 1 and the second inverting unit 3 are turned on, at the time of inversion of the output potential, on the sides of potential that are mutually opposite with respect to the output potential. Because of this, to ensure the inversion operation, in the first embodiment, the driving capability of the first PMOS transistor 5 has to be chosen higher than the driving capability of the second PMOS transistor 11, and also, the driving capability of the first NMOS transistor 7 has to be chosen higher than the driving capability of the second NMOS transistor 9. Further, in the second embodiment, it is necessary to choose the driving capability of the first PMOS transistor 5 to be higher than the driving capability of the fourth NMOS transistor 19, as well as the driving capability of the first NMOS transistor 7 to be chosen higher than the driving capability of the fourth PMOS transistor 17.

Figure 7:
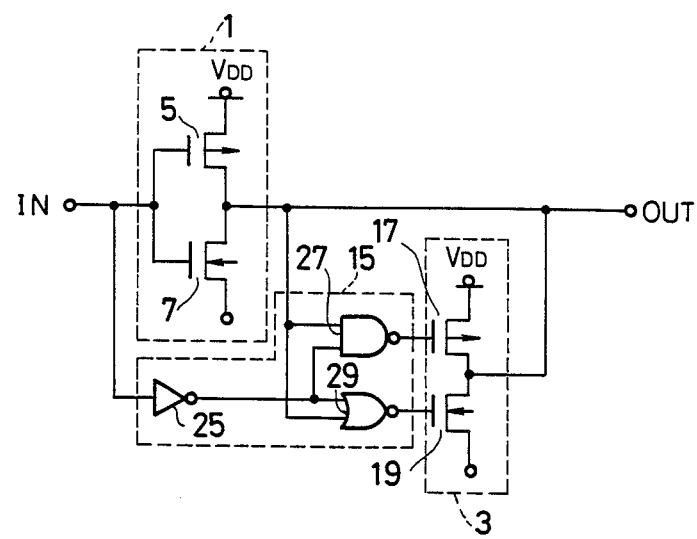
FIG. 7 is a circuit diagram for a third embodiment of the inverter circuit in accordance with the present invention.

In FIG. 7 is shown a third embodiment of the inverter circuit in accordance with the present invention. The special feature of the embodiment resides in that the control unit 15 shown in the second embodiment is composed of a NOT gate 25, a NAND gate 27 and a NOR gate 29, to prevent, in the inverter circuit shown in the first and the second embodiments, the simultaneous operation of the first inverting unit 1 and the second inverting unit 3 on the opposite potential sides with respect to the output potential.

The NOT gate has its input terminal connected to the input terminal IN of the inverter circuit, and its output terminal is connected to one end of the input terminals of the NAND gate 27 that has a two-input terminal, as well as to one end of the input terminals of the NOR gate 29 that has a two-input terminal. The other end of the input terminals of the NAND gate 27 and the NOR gate 29 is connected to the output terminal OUT, and the output terminal of the NAND gate 27 is connected to the gate terminal of the fourth PMOS transistor 17, while the output terminal of the NOR gate 29 is connected to the gate terminal of the fourth NMOS transistor 19.

With such a configuration, it is arranged that when the output potential exceeds the threshold potential for the NAND gate 27 and the NOR gate 29, the second inverting unit 3 of the inverter circuit is activated so that the driving capability of the inverter circuit as a whole will become increased. Accordingly, its output potential will possess characteristics similar to what was shown in FIG. 4. Further, during the period from inversion of the input potential to the attainment of the threshold voltage $V_t$ for the NAND gate 27 and the NOR gate 29, the second inverting unit 3 is in the state of high impedance, and the first inverting unit 1 alone is operated. Therefore, the first inverting unit 1 and the second inverting unit 3 will never be turned on simultaneously on the opposite potential sides with respect to the output potential. It is to be noted that the components with identical symbols as in FIG. 5 indicate the identical items and their description was omitted.

Figure 8:
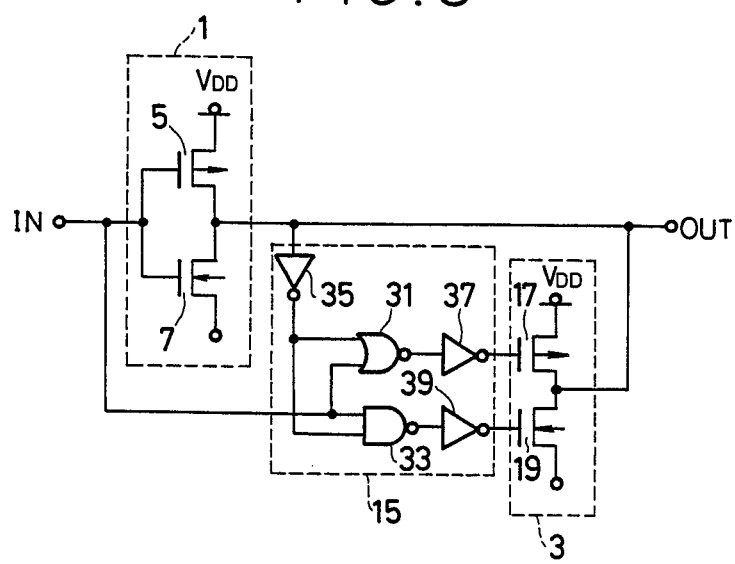
FIG. 8 is a circuit diagram for a fourth embodiment of the inverter circuit in accordance with the present invention.

In FIG. 8 is shown an inverter circuit for a fourth embodiment of the present invention. In this inverter circuit a control unit 15 for controlling the second inverting unit 3 is provided in the first half of the second inverting unit 3, analogous to the inverter circuit shown in FIG. 7.

The control unit 15 consists of a NOT gate, a NAND gate and a NOR gate. The NOR gate 31 and the NAND gate 33 have one ends of their respective input terminals connected to the input terminal IN, an have the other ends of their respective input terminals connected to the output terminal OUT via the NOT gate 35. The output terminal of the NOR gate 31 is connected via the NOT gate 37 to the gate terminal of the fourth PMOS transistor 17, and the output terminal of the NAND gate 33 is connected via the NOT gate 39 to the gate terminal of the fourth NMOS transistor 19. Further, the components with identical symbols as in FIG. 5 indicate the identical items and their description was omitted With such a configuration, it is possible to obtain the input and output characteristics also similar to those of FIG. 7, and hence similar effects.

Figure 9:
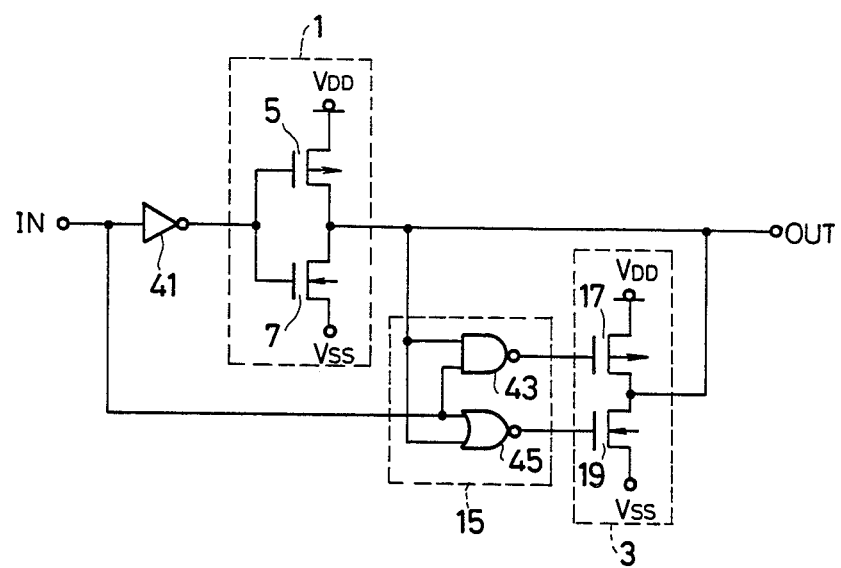
FIG. 9 is a circuit diagram for the buffer circuit for a fifth embodiment of the present invention.

In FIG. 9 is shown a buffer circuit in accordance with the fifth embodiment of the present invention. A special feature of the circuit exists in that the buffer operation is carried out by connecting a NOT gate 41 between the input terminal IN and the first inverting unit 1, and the overshoot and the undershoot phenomena in the rise and fall operations, respectively, of the output potential is suppressed by providing a control unit 15 in the first half of the second inverting unit 3.

The control unit 15 consists of a NAND gate and a NOR gate. A NAND gate 43 and a NOR gate 45 have one ends of their respective input terminals connected to the input terminal IN, and the other ends of their respective input terminals connected to the output terminal OUT. The output terminal of the NAND gate 43 is connected to the gate terminal of the fourth PMOS transistor 17, and the output terminal of the NOR gate 45 is connected to the gate terminal of the fourth NMOS transistor 19. Components with identical symbols with those of FIG. 5 indicate the identical items and their description was omitted.

With such a configuration, the second inverting unit 3 starts to operate when the output voltage exceeds the threshold voltage $V_t$ for the NAND gate 43 and the NOR gate 45, to increase the driving capability of the buffer circuit as a whole, and the rise and fall operations of the output potential are divided in two steps similar to the inverter circuit shown in FIG. 7.

Figure 10:
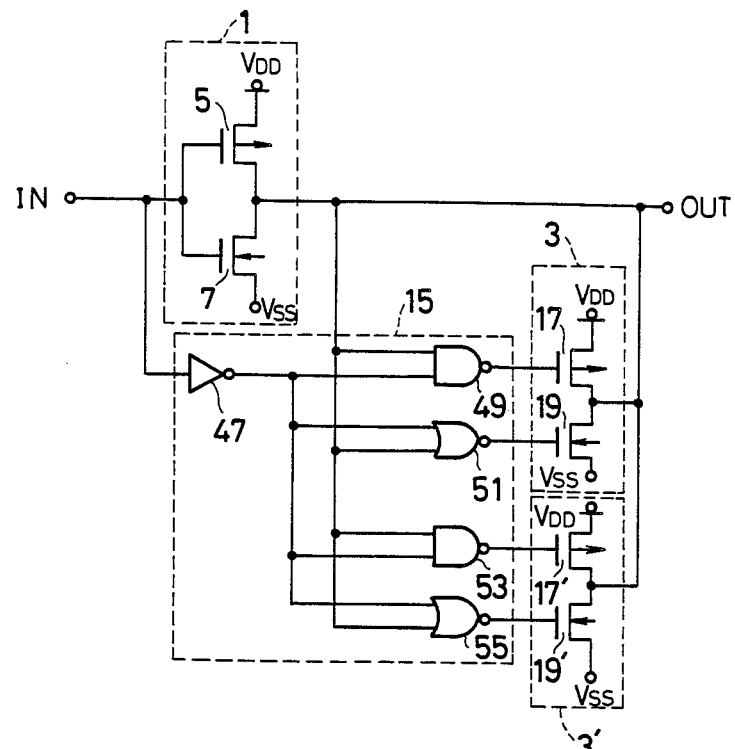
FIG. 10 is a circuit diagram for a sixth embodiment of the inverter circuit in accordance with the present invention.

In FIG. 10 is shown an inverter circuit in accordance with the sixth embodiment of the present invention. A special feature of the circuit is that there is provided, for the output terminal OUT, a third inverting unit 3' that has the same configuration and mechanism as the second inverting unit 3, in parallel with the unit 3, the inversion operations of the third inverting unit 3' and the second inverting unit 3 are controlled by the control unit 15 based on the output potential, to vary the driving capability of the inverter circuit as a whole in three stages.

The control unit 15 consists of a NOT gate, NAND gates, and NOR gates. The NAND gates 49 and 53 and the NOR gates 51 and 55 have one ends of their respective input terminals connected to the output terminal OUT, and the other ends of their respective input terminals connected to the input terminal IN via the NOT gate 47. The output terminal of the NAND gate 49 is connected to the gate terminal of the fourth PMOS transistor 17, and the output terminal of the NOR gate 51 is connected to the gate terminal of the fourth NMOS transistor 19. Further, the output terminal of the NAND gate 53 is connected to the gate terminal of a fifth P-channel MOS type transistor 17' that constitutes a third inverting unit 3', and the output terminal of the NOR gate 55 is connected to a fifth N-channel MOS type transistor 19'.

Figure 11:
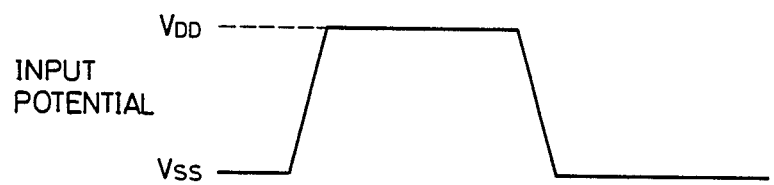
FIG. 11 is a graph for showing the input and output characteristics of the inverter circuit shown in FIG. 10.
Figure 11:
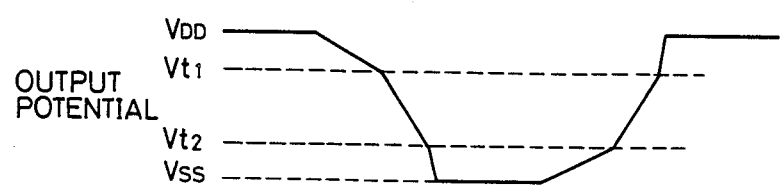

With such a configuration, in the fall operation, for example, of the output potential, when the input potential changes from the low level to the high level, the first inverting unit 1 operates first, and the output potential drops from potential $V_{DD}$ to the threshold voltage $V_{t1}$ for the NAND gate 53 and the NOR gate 55, when the third inverting unit 3' begins to operate. When the output potential drops further to the threshold voltage $V_{t2}$ for the NAND gate 49 and the NOR gate 51, the second inverting unit 3 begins to operate. In this way, the driving capability of the inverter circuit is arranged to be increased successively. In a similar manner, in the rise operation of the output potential, too, the driving capability of the inverter circuit is increased successively. Accordingly, the inverter circuit in this embodiment has the input and output characteristics as shown in FIG. 11, and it is possible to obtain the same effects as in the inverter circuit described in the third embodiment.

Figure 12:
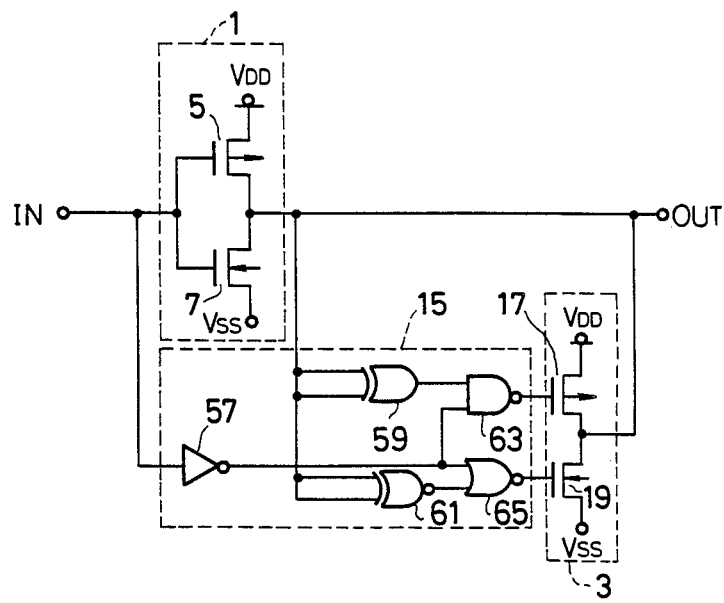
FIG. 12 is a circuit diagram for a seventh embodiment of the inverter circuit in accordance with the present invention.

In FIG. 12 there is shown an inverter circuit in accordance with a seventh embodiment of the present invention. A special feature of the circuit exists in that the control unit 15 that has an EXCLUSIVE-OR gate and an EXCLUSIVE-NOR gate that have different threshold voltages for the two input terminals, controls the operation of the second inverting unit 3, based on the output potential. With this, it is arranged that the fall and rise of the output potential is to take place slowly, by reducing the driving capability of the inverter circuit in the vicinity of potential $V_{SS}$ or potential $V_{DD}$ of the output potential.

The control unit 15 consists of a NOT gate, an EXCLUSIVE-OR gate (called "EX.OR gate" hereinafter), an EXCLUSIVE-NOR gate (called "EX.NOR gate" hereinafter), a NAND gate, and a NOR gate. The respective input terminals of the EX.OR gate 59 and the EX.NOR gate 61, that have the threshold voltage of $V_{t1}$ and $V_{t2}$ for the two input terminals, respectively, are connected to the output terminal OUT, the output terminal of the EX.OR gate 59 is connected to one end of the input terminals of the NAND gate 63, and the output terminal of the EX.NOR gate 61 is connected to one end of the input terminals of the NOR gate 65. The other ends of the respective input terminals of the NAND gate 63 and the NOR gate 65 are connected to the input terminal IN via the NOT gate 57, the output terminal of the NAND gate 63 is connected to the gate terminal of the fourth PMOS transistor 17, and the output terminal of the NOR gate 65 is connected to the gate terminal of the fourth NMOS transistor 19. Further, the components with identical symbols as in FIG. 5 indicate the identical items and their description will be omitted.

Figure 13:
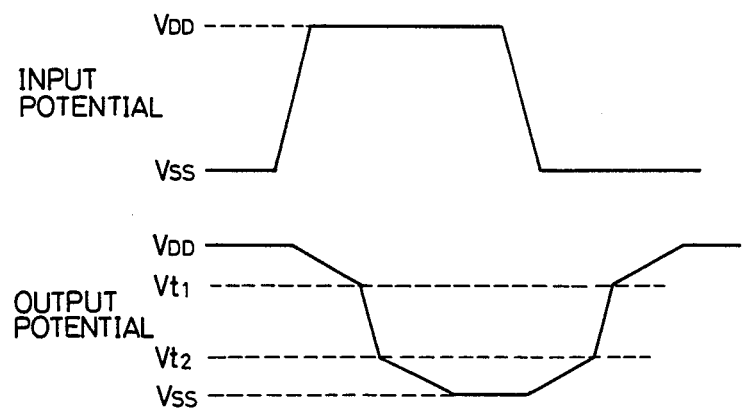
FIG. 13 is a graph for showing the input and output characteristics of the inverter circuit shown in FIG. 12.

IN such a configuration, in the fall operation, for example, of the output potential, when the output potential lies between potentials $V_{t1}$ and $V_{t2}$, a low level signal is output from the EX.NOR gate 61 to the NOR gate 65, the NOR gate 65 supplies, upon receipt of the low level signal, a high level signal to the fourth NMOS transistor 19 of the second inverting unit 3, and the fourth NMOS transistor becomes turned on. Therefore, the driving capability of the inverter circuit as a whole is increased, and the output potential drops rapidly. When the output potential lies between potentials $V_{DD}$ and $V_{t1}$ and between potentials $V_{t2}$ and $V_{SS}$, the first NMOS transistor 7 alone of the first inverting unit 1 becomes turned on. The second inverting unit 3 becomes high impedance state, so that the output potential falls slowly. Further, in the rise operation of the output potential, analogous to the fall operation, only when the output potential lies between potential $V_{t1}$ and potential $V_{t2}$, the driving capability of the inverter circuit as a whole is increased. Accordingly, in the inverter circuit of the present embodiment, there are obtained the input and output characteristics as shown in FIG. 13, and effects similar to the inverter circuit explained in the third embodiment can be obtained.

Figure 14:
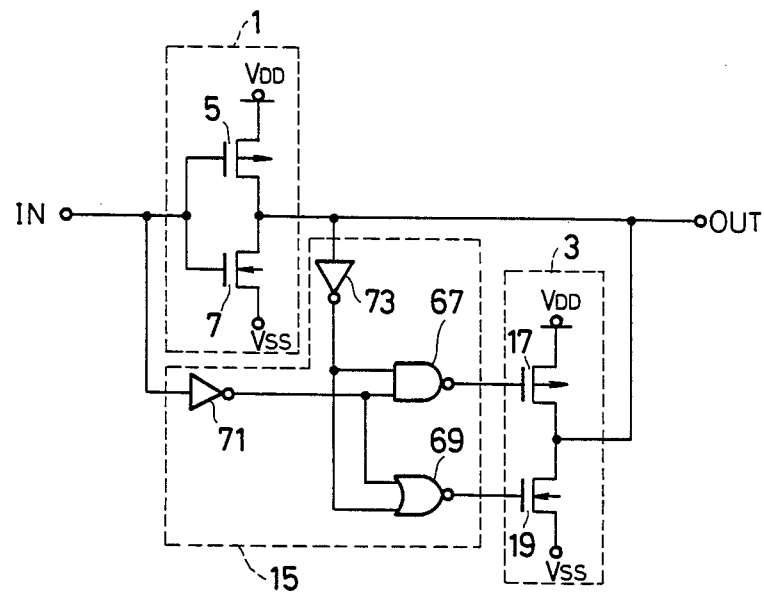
FIG. 14 a circuit diagram for an eighth embodiment of the inverter circuit in accordance with the present invention.

In FIG. 14 is shown an inverter circuit in accordance with an eighth embodiment of the present invention. A special feature of the circuit is that, similar to the second embodiment, there is provided in the first half of the second inverting unit 3 a control unit 15 that controls the operation of the second inverting unit 3 based on the output potential. In the rise and the fall operations of the output potential, contrary to the input and output characteristics of the third embodiment, the output potential is first dropped or raised rapidly by increasing the driving capability of the inverter circuit as a whole, and the output potential is made to fall or rise slowly by decreasing the driving capability for the in-between.

The control unit 15 consists of two NOT gates, a NAND gate and a NOR gate. The NAND gate 67 and the NOR gate 69 have one ends of their respective input terminals connected via the NOT gate 71 to the input terminal IN, and the other ends of their respective input terminals are connected via the NOT gate 73 to the output terminal OUT. Further, the output terminal of the NAND gate 67 is connected to the gate terminal of the fourth PMOS transistor 17, and the output terminal of the NOR gate 69 is connected to the gate terminal of the fourth NMOS transistor 19. In addition, the components with identical symbols as in FIG. 5 indicate the identical items and their description is omitted.

With such a configuration, in the fall operation, for example, of the output potential, when the input potential changes from low level to high level, the first NMOS transistor is turned on. Until the output potential drops to the threshold voltage $V_t$ of the NOT gate 73, low level signals will be input to both of the input terminals of the NOR gate 69, so that the NOR gate supplies high level output signals to the fourth NMOS transistor 19 which will also become turned on. Accordingly, the driving capability of the inverter circuit as a whole is increased, and the output potential is lowered rapidly.

When the output potential drops to potential $V_t$, there will be input high level signals to the input terminal of the NOR gate 69 that is connected via the NOT gate 73 to the output terminal OUT. Therefore, low level output signals will be supplied from the NOR gate 69 to the fourth NMOS transistor 19, the fourth NMOS transistor 19 is turned off reducing the driving capability of the inverter circuit as a whole, leading to a slow drop of the output potential. In addition, in the rise operation of the output potential, similar to the fall operation, the driving capability of the inverter circuit as a whole is decreased when the output potential exceeds potential $V_t$, and the input and output characteristics as shown in FIG. 15 will be obtained.

Figure 15:
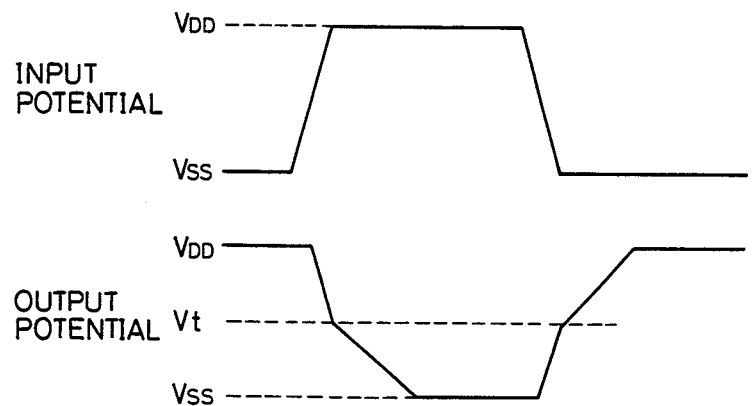
FIG. 15 is a graph for showing the input and output characteristic of the inverter circuit shown in FIG. 14.

In the input and output characteristics as shown in FIG. 15, although a large transient current flows in the beginning, after the output potential crosses potential $V_t$, the driving capability is weakened and the transient current is suppressed. Because of this, when the output potential is in the vicinity of potential $V_{DD}$ or potential $V_{SS}$, the transient current is reduced considerably so that it becomes possible to suppress the overshoot or undershoot phenomenon. Moreover, for elements such as a CMOS circuit that is operated based on the level of the input signal, it is possible to shorten the transmission time, as the output potential is lowered rapidly in the beginning.

Figure 16:
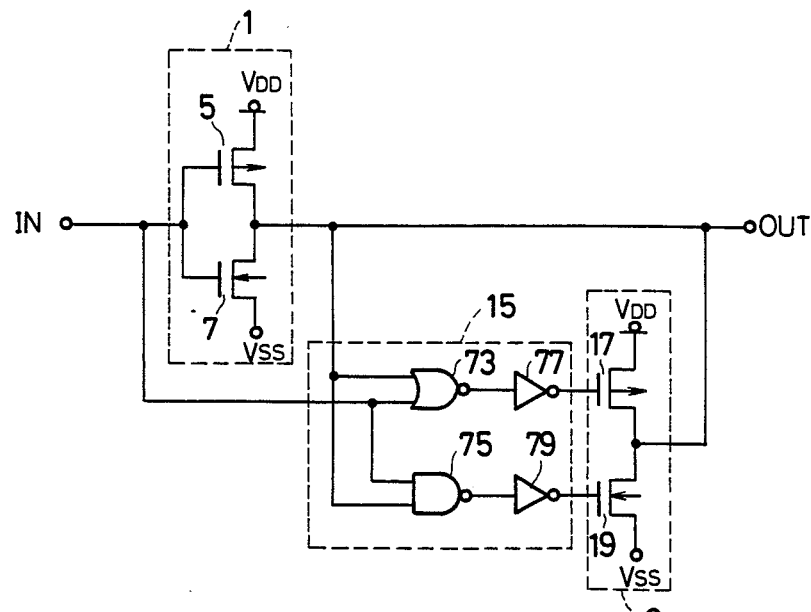
FIG. 16 is a circuit diagram for a ninth embodiment of the inverter circuit it in accordance with the present invention.

In FIG. 16 is shown an inverter circuit in accordance with a ninth embodiment of the present invention. In the ninth embodiment, the control unit 15 is formed by a circuit which is different from the circuit shown in the eighth embodiment, and the control on the operation of the second inverting unit 3 is arranged to be carried out in a way similar to the eighth embodiment.

The control unit 15 consists of NOT gates, a NAND gate, and a NOR gate. One ends of the respective input terminals of the NOR gate 73 and the NAND gate 75 are connected to the input terminal IN of the inverter circuit, and the other ends of their respective input terminals are connected to the output terminal OUT of the inverter circuit. Further, the output terminal of the NOR gate 73 is connected via the NOT gate 77 to the gate terminal of the fourth PMOS transistor 17, and the output terminal of the NAND gate 75 is connected via the NOT gate 79 to the gate terminal of the fourth NMOS transistor 19. In addition, the components with identical symbols as in FIG. 5 indicate the identical items and their description is omitted.

With such a configuration, it is possible to obtain the input and output characteristics that are similar to those shown in FIG. 15, and also the effects that are similar to the eighth embodiment.

Figure 17:
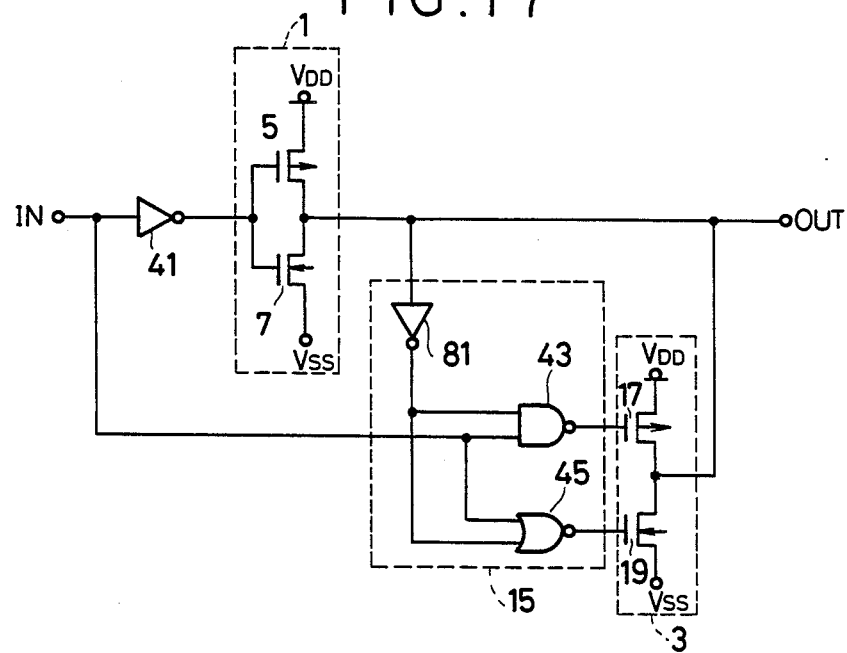
FIG. 17 is a circuit diagram for the buffer circuit for a tenth of the present invention.

In FIG. 17 is shown an inverter circuit in accordance with a tenth embodiment of the present invention. In this embodiment, in the control unit 15 of the buffer circuit of the fourth embodiment shown in FIG. 9, the input terminals of the NAND gate 43 and the NOR gate 45 that are not connected on the side of the input terminal IN of the buffer circuit are connected via the NOT gate 81 to the output terminal OUT of the buffer circuit, to construct the control unit 15 of the buffer circuit for this embodiment. In addition, the component with identical symbols as in FIG. 5 indicate the identical items and their description was omitted.

With such a configuration, in the rise operation, for example, of the output potential, until the output potential arrives at the threshold voltage $V_t$ of the NOT gate 81, the first PMOS transistor 5 and the fourth PMOS transistor 17 are in on-state so that the output potential is raised rapidly by the increase in the driving capability of the inverter circuit as a whole. When the output potential becomes potential $V_t$, the fourth PMOS transistor 17 becomes turned off so that the output potential is raised slowly because of the weakening of the driving capability. Further, in the fall operation of the output potential, analogous to the rise operation, the output potential falls rapidly in the beginning, but the output potential falls slowly when the output potential becomes potential $V_t$. Accordingly, effects similar to the eighth embodiment can be obtained.

Figure 18:
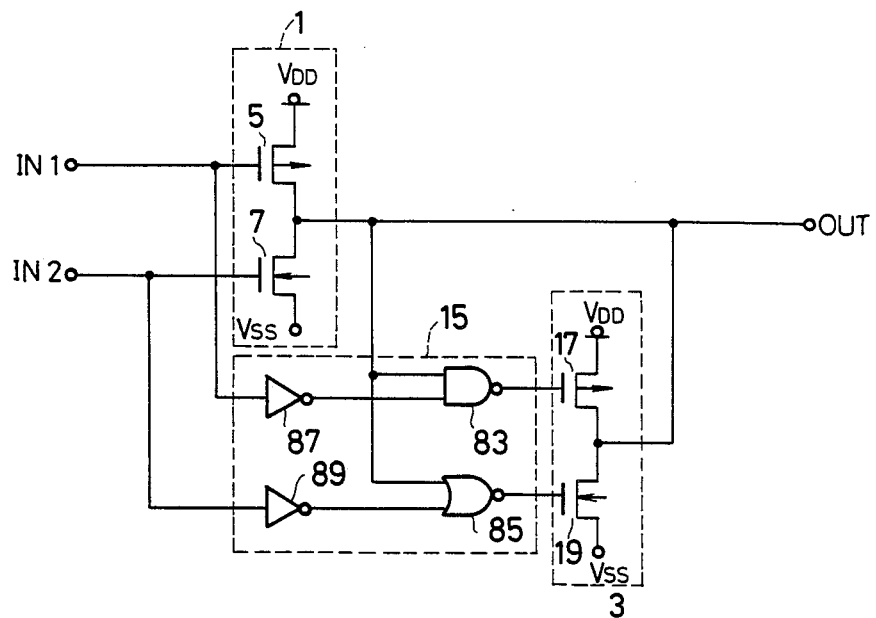
FIG. 18 is a circuit diagram for an eleventh embodiment of the inverter circuit in accordance with the present invention.

In FIG. 18 there is shown an inverter circuit in accordance with an eleventh embodiment of the present invention. A special feature of the circuit is that it is arranged to render the output terminal OUT a high impedance state by means of the signal states of the two input terminals that are provided in the inverter circuit.

In FIG. 18, the gate terminal of the first PMOS transistor 5 that constitutes the first inverting unit is connected to the input terminal $IN_1$, and the gate terminal of the first NMOS transistor 7 is connected to the input terminal $IN_2$. The control unit 15 is constructed by NOT gates, a NAND gate, and a NOR gate, and one end of the input terminals of the NAND gate 83 is connected via the NOT gate 87 to the input terminal $IN_1$ of the inverter circuit, and the other end of its input terminals is connected to the output terminal OUT of the inverter circuit, and its output terminal is connected to the gate terminal of the fourth PMOS transistor 17.

The NOR gate 85 has one of its input terminals connected via the NOT gate 89 to the input terminal $IN_2$ of the inverter circuit, the other end of the input terminals connected to the output terminal OUT of the inverter circuit, and its output terminal is connected to the gate terminal of the fourth NMOS transistor 19. In addition, the components with symbols identical to those in FIG. 5 indicate the identical items and their description was omitted.

With such a configuration, when a high level signal is input to the input terminal $IN_1$ and a low level signal is input to the input terminal $IN_2$, both of the first PMOS transistor 5 and the first NMOS transistor 7 becomes turned off. Further, to one of the input terminals of the NAND gate 83 is input a low level signal via the NOT gate 87, and a high level signal is supplied from the output terminal of the NAND gate 83 to the gate terminal of the fourth PMOS transistor 17, and the fourth PMOS transistor 17 becomes turned off. Further, to one of the input terminals of the NOR gate 85 there is input a high level signal via the NOT gate 89, a low level signal is supplied from the output terminal of the NOR gate 85 to the gate terminal of the fourth NMOS transistor 19, and the fourth NMOS transistor 19 becomes turned off.

Accordingly, when a high level signal is input to the input terminal $IN_1$ and a low level signal is input to the input terminal $IN_2$, regardless of the state of the output potential, the output terminal OUT becomes a state of high impedance. Further, when signals of the same phase are input to both input terminals of $IN_1$ and $IN_2$, there are obtained input and output characteristics that are similar to those of the inverter circuit of the third embodiment shown in FIG. 7, and also the same effects as for the third embodiment.

Figure 19:
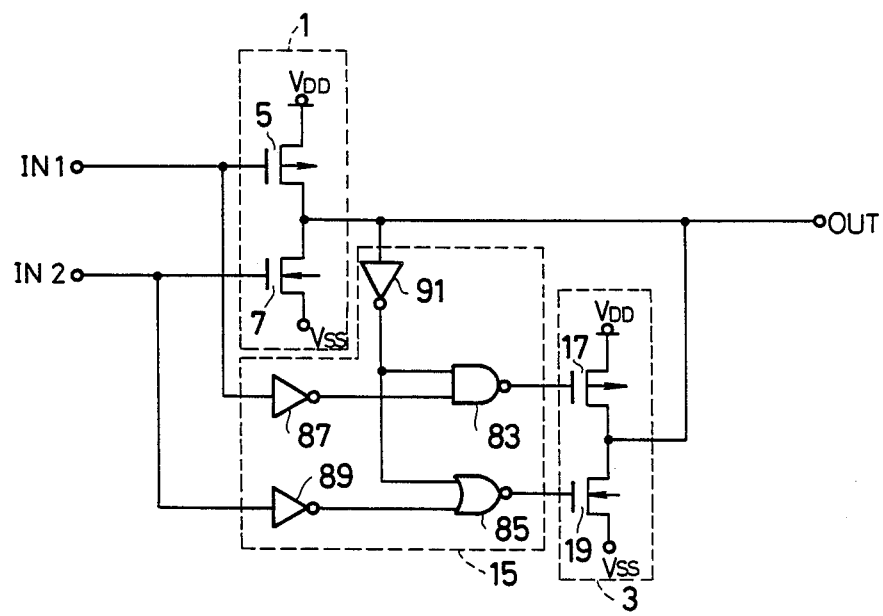
FIG. 19 is a circuit diagram for a twelfth embodiment of the inverter circuit in accordance with the present invention.

In FIG. 19 there is shown an inverter circuit in accordance with a twelfth embodiment of the present invention. A special feature of the circuit is that, in the control unit 15 in FIG. 18, the input terminals of the NAND gate 83 and the NOR gate 85, on the side that are not connected to the NOT gates 87 and 89, are connected via the NOT gate 91 to the output terminal OUT, to construct the control unit 15 for the inverter circuit for this embodiment. Analogous to the inverter circuit shown in FIG. 18, irrespective of the state of the output potential, it is arranged to be able to render the output terminal OUT to be a state of high impedance. Moreover, the inverter circuit of the present embodiment possesses input and output characteristics similar to those shown in FIG. 15, and is possible to obtain effects that are similar to those of the eighth embodiment. In addition, the components with identical symbols as in FIG. 18 indicate the identical items and their description was omitted.

In summary, according to the present invention, the transient current that arises at the time of charging or discharging of the load that is connected to the output terminal is suppressed by controlling the driving capability of the output circuit device in response to the output potential. Therefore, it is possible to suppress the overshoot and the undershoot phenomena in the output potential, which permits to improve the stability of the output potential.

Various modifications will become possible for those skilled in the art after receiving the teachings of the present disclosure without departing from the scope thereof.

What is claimed is:

1. An output circuit device which comprises:
(a) first circuit means for inverting an input signal, said first circuit means having a first conductivity type MOS transistor and a second conductivity type MOS transistor connected in series to each other, the first conductivity type MOS transistor having a source connected to a first power supply and the second conductivity type MOS transistor having a source connected to a second power supply, and the first and second conductivity type MOS transistors having gates connected to an input terminal, said first circuit having an output connected to said transistors for supplying said inverted input signal as an output signal;
(b) second circuit means having an output terminal for connection to a load having a parasitic capacitance, said parasitic capacitance being connectable to said output terminal such that the output signal from said first circuit means charges and discharges the parasitic capacitance, and an input and further being connected to said first circuit means for controlling a charging and discharging speed of said parasitic capacitance in accordance with a voltage of the output sinal, said second circuit means having at least a first conductivity type MOS transistor and a second conductivity type MOS transistor connected in series to each other, said second circuit means being connected between the output of said first circuit means and the output terminal, the first conductivity type MOS transistor in the second circuit means having a source connected to the first power supply, the second conductivity type MOS transistor in the second circuit means having a source connected to the second power supply; and
(c) control means connected between the output of said first circuit means and the input of said second circuit means for controlling the operation of said second circuit means in accordance with the voltage of the output signal, said control means comprising NAND and NOR gates having inputs connected to each other and an inverter connected between the input terminal of said first circuit means and said connected inputs, said gates having outputs connected to said second circuit means.

2. An output circuit device which comprises:
(a) first circuit means for inverting an input signal, said first circuit means having a first conductivity type MOS transistor and a second conductivity type MOS transistor connected in series to each other, the first conductivity type MOS transistor having a source connected to a first power supply and the second conductivity type MOS transistors having a source connected to a second power supply, and the first and second conductivity type MOS transistors having gates connected together to an input terminal, said first circuit having an output connected to said transistors for supplying said inverter input signal as an output signal;
(b) second circuit means having an output terminal for connection to a load having a parasitic capacitance, said parasitic capacitance being connectable to said output terminal such that the output signal from said first circuit means charges and discharges the parasitic capacitance, and inputs and further being connected to said first circuit means for controlling a charging and discharging speed of said parasitic capacitance in accordance with a voltage of the output signal, said second circuit means having at least a first conductivity type MOS transistor and a second conductivity type MOS transistor connected in series to each other, said second circuit means being connected between the output of said first circuit means and the output terminal, the first conductivity type MOS transistor in the second circuit means having a source connected to the first power supply, the second conductivity type MOS transistor in said second circuit means having a source connected to the second power supply; and
(c) control means connected between the output of said first circuit means and the input of said second circuit means for controlling the operation of said second circuit means in accordance with the voltage of the output signal, said control means comprising NAND and NOR gates having inputs connected to each other, a first inverter connected between the output of said first circuit means and the connected inputs of said NAND and NOR gates, and second and third inverters connected between gates of said transistors of said second circuit means and outputs of said NAND and NOR gates respectively.

3. An output circuit device which comprises:
(a) first circuit means for inverting an input signal, said first circuit means having a first conductivity type MOS transistor and a second conductivity type MOS transistor connected in series to each other, the first conductivity type MOS transistor having a source connected to a first power supply and the second conductivity type MOS transistor having a source connected to a second power supply, and the first and second conductivity type MOS transistors having gates connected to an input of said first circuit means, said input of said first circuit means being connected together to an input terminal, said first circuit having an output connected to said transistors for supplying said inverted input signal as an output signal;
(b) second circuit means having an output terminal for connection to a load having a parasitic capacitance, said parasitic capacitance being connectable to said output terminal such that the output signal from said first circuit means charges and discharges the parasitic capacitance, and an input and further being connected to said first circuit means for controlling a charging and discharging speed of said parasitic capacitance in accordance with a voltage of the output signal, said second circuit means having at least a first conductivity type MOS transistor and a second conductivity type MOS transistor connected in series to each other, said second circuit means being connected between the output of said first circuit means and the output terminal, the first conductivity type MOS transistor in the second circuit means having a source connectred to the first power supply, the second conductivity type MOS transistor of said second circuit means having a source connected to the second power supply;
(c) control means connected between the output of said first circuit means and the input of said second circuit means for controlling the operation of said second circuit means in accordance with the voltage of the output signal, said control means comprising NAND and NOR having inputs connected to each other; and (d) an inverter having one terminal connected to the input of said first circuit means and another terminal connected to one input of said NOR gate and to said input terminal.

4. An output circuit device which comprises:

(a) first circuit means for inverting an input signal, said first circuit means having a first conductivity type MOS transistor and a second conductivity type MOS transistor connected in series to each other, the first conductivity type MOS transistor having a source connected to a first power supply and the second conductivity type MOS transistor having a source connected to a second power supply, and the first and second conductivity type MOS transistors having gates connected together to an input terminal, said first circuit having an output connected to said transistors for supplying said inverted input signal as an output signal;

(b) second circuit means having an output terminal for connection to a load having a parasitic capacitance, said parasitic capacitance being connectable to said output terminal such that the output signal from said first circuit means charges and discharges the parasitic capacitance, and an input and further being connected to said first circuit means for controlling a charging and discharging speed of said parasitic capacitance in accordance with the voltage of the output signal, said second circuit means comprising two pairs of transistors, each pair of transistors comprising a first type MOS transistor and a second type MOS transistor connected in series with each other, the transistors of each pair having drains connected to drains of the transistors of the other pair, said second circuit means being connected between the output of said first circuit means and the output terminal, each first conductivity type MOS transistor in the second circuit means having a source connected to the first power supply, each second conductivity type MOS transistor in the second circuit means having a source connected to the second power supply; and (c) control means connected between the output of said first circuit means and the input of said second circuit means for controlling the operation of said second circuit means in accordance with a voltage of the output signal, said control means comprising two pairs of NAND and NOR gates, said NAND and NOR gate pairs having first and second switching threshold levels, respectively, and having outputs connected to gates of the first and second type MOS transistor pairs in the second circuit means; and (d) an inverter connected between the input terminal of said first circuit means and an input of each of said NAND and NOR gate pairs in the control means.

5. An output circuit device which comprises:

(a) first circuit means for inverting an input signal, said first circuit means having a first conductivity type MOS transistor and a second conductivity type MOS transistor connected in series to each other, the first conductivity type MOS transistor having a source connected to a first power supply and the second conductivity type MOS transistor having a source connected to a second power supply, and the first and second conductivity type MOS transistors having gates connected together to an input terminal, said first circuit having an output connected to said transistors for supplying said invertd input signal as an output signal;

(b) second circuit means having an output terminal for connection to a load having a parasitic capacitance, said parasitic capacitance being connectable to said output terminal such that the output signal from said first circuit means charges and discharges the parasitic capacitance, and an input and further being connected to said first circuit means for controlling a charging and discharging speed of said parasitic capacitance in accordance with a voltage of the output signal, said second circuit means having at least a first conductivity type MOS transistor and a second conductivity type MOS transistor connected in series to each other, said second circuit means being connected between the output of said first circuit means and the output terminal, the first conductivity type MOS transistor in the second circuit means having a source connected to the first power supply, the second conductivity type MOS transistor having a source connected to the second power supply; and (c) control means connected between the output of said first circuit means and the input of said second circuit means for controlling the operation of said second circuit means in accordance with the voltage of the output signal, said control means comprising NAND and NOR gates having outputs connected, respectively, to the M0S transistors in the second circuit means, an EXCLUSIVE-0R and EXCLUSIVE-NOR gate pair having outputs connected, respectively, to inputs and said NAND and NOR gates, and an inverter connected between the input terminal of the first circuit means and a second input of said NOR gate.

6. An output circuit device which comprises:

(a) first circuit means for inverting an input signal, said first circuit means having a first conductivity type MOS transistor and a second conductivity type MOS transistor connected in series to each other, the first conductivity type MOS transistor having a source connected to a first power supply and the second conductivity type MOS transistor having a source connected to a second power supply, and the first and second conductivity type MOS transistors having gates connected together to an input terminal, said first circuit having an output connected to said transistors for supplying said inverted input signal as an output signal;

(b) second circuit means having an output terminal for connection to a load having a parasitic capacitance, said parasitic capacitance being connectable to said output terminal such that the output signal from said first circuit means charges and discharges the parasitic capacitance, and an input, and further being connected to said first circuit means for controlling a charging and discharging speed of said parasitic capacitance in accordance with a voltage of the output signal, said second circuit means having at least a first conductivity type MOS transistor and a second conductivity type MOS transistor connected in series to each other, said second circuit means being connected between an output of circuit means and the output terminal, the first conductivity type MOS transistor in the second circuit means having a source connecter to the first power supply, the second conductivity type MOS transistor of the second circuit means having a source connected to the second power supply; and (c) control means connected between the output of said first circuit means and the input of said second circuit means for controlling the operation of said second circuit means in accordance with the voltage of the output signal, said control means comprising NAND and NOR gates having outputs connected, respectively, to the first and second type MOS transistors of the second circuit means and having first inputs connected together and second inputs connected together, a first inverter connected between the input terminal of the first circuit means and said first inputs of said NAND and NOR gates and a second inverter connected between the output of said first circuit means and the sercond inputs of said NAND and NOR gates.

7. An output circuit device which comprises:

(a) first circuit means for inverting an input signal, said first circuit means having a first conductivity type MOS transistor and a second conductivity type MOS transistor connected in series to each other, the first conductivity type MOS transistor having a source connected to a first power supply and the second conductivity type MOS transistor having a source connected to a second power supply, and the first and second conductivity type MOS transistors having gates connected to an input terminal, said first circuit having an output connected to said transistors for supplying said inverted input signal as an output signal;

(b) second circuit means having an output terminal for connection to a load having a parasitic capacitance, said parasitic capacitance being connectable to said output terminal such that the output signal from said first circuit means charges and discharges the parasitic capacitance, and an input and further being connected to said first circuit means for controlling a charging and discharging speed of said parasitic capacitance in accordance with a voltage of the output signal, said second circuit means having at least a first conductivity type MOS transistor and a second conductivity type MOS transistor connected in series to each other, said second circuit means being connected between the output of said first circuit means and the output terminal, the first conductivity type MOS transistor in the second circuit means having a source connected to the first power supply, the second conductivity type MOS transistor in the second circuit means having a source connected to the second power supply; and (c) control means connected between the output of said first circuit means and the input of said second circuit means for controlling the operation of said second circuit means in accordance with the voltage of the output signal, said control means comprising a NOR and NAND gate pair and first and second inverters connected respectively between outputs of said NOR and NAND gate pair and gates of the first and second type MOS transistors in the second circuit means, said NAND and NOR gates of said pair having one input each connected to the output of the first circuit means and another input each connected to the input terminal of the first circuit means.

8. An output circuit device which comprises:

(a) first circuit means for inverting an input signal, said first circuit means having a first conductivity type MOS transistor and a second conductivity type MOS transistor connected in series to each other, the first conductivity type MOS transistor having a source connected to a first power supply and the second conductivity type MOS transistor having a source connected to a second power supply, and the first and second conductivity type MOS transistors having gates connected together to an input terminal, said first circuit having an output connected to said transistors for supplying said inverted input signal as an output signal;

(b) second circuit means having an output terminal for connection to a load having a parasitic capacitance, said parasitic capacitance being connectable to said output terminal such that the output signal from said first circuit means charges and discharges the parasitic capacitance, and an input and further being connected to said first circuit means for controlling a charging and discharging speed of said parasitic capacitance in accordance with a voltage of the output signal, said second circuit means having at least a first conductivity type MOS transistor and a second conductivity type MOS transistor connected in series to each other, said second circuit means being connected between the output of said first circuit means and the output terminal, the first conductivity type MOS transistor in the second circuit means having a source connected to the first power supply, the second conductivity type MOS transistor in the second circuit means having a source connected to the second power supply; and (c) control means connected between the output of said first circuit means and the input of said second circuit means for controlling the operation of said second circuit means in accordance with a voltage of the output signal, said control means comprising a NAND and NOR gate pair and a first inverter, said NAND and NOR gates of said pair having outputs connected, respectively, to gates of the first and second type MOS transistors in the second circuit means, and having first inputs connected to each other and to an output of said first inverter, and second inputs connected to other; and (d) a second inverter connected between the gates of the transistors of said first circuit means and the input terminal which is in turn connected to said connected second inputs of said NAND and NOR gate pair.

9. An outut circuit device which comprises:

(a) first circuit means for inverting an input signal, said first circuit means having a first conductivity type MOS transistor and a second conductivity type MOS transistor connected in series to each other, the first conductivity type MOS transistor having a source connected to a first power supply and the second conductivity type MOS transistor having a source connected to a second power supply, and the first and second conductivity type MOS transistors having gates connected, respectively, to input terminals, said first circuit having an output connected to said transistors for supplying said inverted input signal as an output signal;

(b) second circuit means having an output terminal for connection to a load having a parasitic capacitance, said parasitic capacitance being connectable to said output terminal such that the output signal from said first circuit means charges and discharges the parasitic capacitance an, and input and further being connected to said first circuit means for controlling a charging and discharging speed of said parasitic capacitance in accordance with a voltage of the output signal, said second circuit means having at least a first conductivity type MOS transistor and a second conductivity type MOS transistor connected in series to each other, said second circuit means being connected between the output of said first circuit means and the output terminal, the first conductivity type MOS transistor in the second circuit means having a source connected to the first power supply, the second conductivity type MOS transistor in the second circuit means having a source connected to the second power supply; and (c) control means connected between the output of said first circuit means and the input of said second circuit means for controlling the operation of said second circuit means in accordance with the voltage of the output signal, said control means comprising a NAND and NOR gate pair and first and second inverters, said NAND and NOR gates of said pair having inputs connected to each other and to the output of the first circuit means, and having outputs connected to gates of the first and second type MOS transistors in the second circuit means, and said first and second inverters having inputs connected, respectively, to said input terminals, and having outputs connected, respectively, to second inputs of said NAND and NOR gates.

10. An output circuit device as claimed in claim 9, wherein said control means further comprises a third inverter connected between the output of the first circuit means and the connected inputs of said NAND and NOR gates.

11. An output circuit device which comprises:
(a) first circuit means for inverting an input signal from an input terminal and supplying the inverted input signal as an output signal;
(b) second circuit means having an output terminal for connection to a load having a parasitic capacitance, said parasitic capacitance being connectable to said output terminal such that the output signal from said first circuit means charges and discharges the parasitic capacitance, and an input and further being connected to said first circuit means for controlling a charging and discharging speed of the parasitic capacitance in accordance with a voltage of the output signal to suppress a transient current generated at the time of charging and discharging the parasitic capacitance; and
(c) control means connected between the output of said first circuit means, the input of said second circuit means and said input terminal for controlling the operation of said second circuit means in accordance with the voltage of the output signal and the input signal.

12. An output circuit device as claimed in claim 11, wherein said control means comprises NAND and NOR gates having inputs connected to each other and an inverter connected between the input terminal of said first circuit means and said connected inputs.

* * * * *